United States Patent [19]

Naito et al.

[11] Patent Number: 5,356,868
[45] Date of Patent: Oct. 18, 1994

[54] HIGHLY ORIENTED SUPERCONDUCTOR OXIDE CERAMIC PLATELETS AND PROCESS FOR THE PRODUCTION THEREOF

[75] Inventors: Naomi Naito, Newtonville; Lorraine A. Jachim, Bedford, both of Mass.

[73] Assignee: GTE Laboratories Incorporated, Waltham, Mass.

[21] Appl. No.: 375,309

[22] Filed: Jul. 3, 1989

[51] Int. Cl.$^5$ .......................................... C01F 17/00
[52] U.S. Cl. ................................. 505/126; 501/152; 501/123; 505/729; 505/779; 505/780; 505/500
[58] Field of Search .................. 505/1, 729, 779, 780; 501/152, 123

[56] References Cited

U.S. PATENT DOCUMENTS

| | | | |
|---|---|---|---|
| 4,824,826 | 4/1989 | Damento et al. | 505/1 |
| 4,843,059 | 6/1989 | Deslandes et al. | 505/1 |
| 4,857,504 | 8/1989 | Hermann et al. | 505/1 |
| 4,861,753 | 8/1989 | McCarron, III | 505/1 |
| 4,870,052 | 9/1989 | Engler et al. | 505/1 |
| 4,876,240 | 10/1989 | Ziolo | 505/1 |
| 4,880,773 | 11/1989 | Itozaki et al. | 505/1 |

FOREIGN PATENT DOCUMENTS

| | | |
|---|---|---|
| 63-176353 | 7/1988 | Japan . |
| 63-207009 | 8/1988 | Japan . |
| 63-225409 | 9/1988 | Japan . |
| 63-225414 | 9/1988 | Japan . |

OTHER PUBLICATIONS

A. J. Panson et al., "Effect of Compositional Variation and Annealing in Oxygen on Superconducting Properties of $Y_1Ba_2Cu_3O_{8-y}$", Phys. Rev. B 35 (16), pp. 8774–8777, 01 Jun. 1987.

S. Hayashi et al., "Growth of $YBa_2Cu_3O_{9-\delta}$ Single Crystals from the High Temperature Solution", Jpn. J. Appl. Phys. 26, pp. 1197–1198, Jul. 1987.

R. F. Cook et al., "Fracture Toughness Measurements of $YBa_2Cu_3O_x$ Single Crystals", Appl. Phys. Lett. 51 (6), pp. 454–456, 10 Aug. 1987.

M. A. Damento et al., "Preparation of Single Crystals of Superconducting $YBa_2Cu_3O_{7-x}$ from CuO Melts", Appl. Phys. Lett. 51 (9), pp. 690–691, 31 Aug. 1987.

N. K. Kim et al., "Preparation, Crystallization and Properties of Rapidly Solidified $YBa_2Cu_3O_{7-\delta}$", Mat. Lett. 5 (10), pp. 387–390, Sep. 1987.

K. Funaki et al., "A Superconducting Sub-Structure in Sintered $YBaCu_3O_{7-x}$ Plates", Jpn. J. Appl. Phys. 26 (9), pp. L1445–L1447, Sep. 1987.

D. L. Kaiser et al., "Growth of $YBa_2Cu_3O_x$ Single Crystals", Appl. Phys. Lett. 51 (13), pp. 1040–1042, 28 Sep. 1987.

H. Haneda et al., "Single Crystal Preparation and Some Characteristics of the Superconducting Y–Ba–Cu Oxide", Appl. Phys. Lett. 51 (22), pp. 1848–1950, 30 Nov. 1987.

A. M. Hermann et al., "Melt-Processable Rare Earth-Ba-Cu-O Superconductors Based on Molten Ba-Cu Oxides", Appl. Phys. Lett. 51 (22), pp. 1854–1856, 30 Nov. 1987.

(List continued on next page.)

Primary Examiner—Mark L. Bell
Assistant Examiner—C. M. Bonnar
Attorney, Agent, or Firm—Frances P. Craig

[57] ABSTRACT

A single phase superconducting oxide ceramic material in the form of highly oriented platelets, and a process for the production thereof. The process involves calcining in a non-reducing atmosphere a homogeneous mixture of stoichiometric proportions of suitable precursor materials. The calcination temperature is below the peritectic melt temperature of the superconducting material, and is at or above a temperature and for a time sufficient to effect partial melting of at least one of the precursor materials to a degree sufficient to effect diffusion of at least one of the precursor materials throughout the mixture. The calcination vessel is not wetted by melts of the precursor materials at the calcination temperature. The calcined material is then annealed in a non-reducing atmosphere. A typical material produced by the process is $YBa_2Cu_3O_x$ superconducting material, at a calcination temperature of about 976°–982° C.

4 Claims, 6 Drawing Sheets

OTHER PUBLICATIONS

F. Holzberg et al., "Single Crystal Growth of the High $T_c$ Superconductor YBa$_2$Cu$_3$O$_x$", *Chemistry of High Temperature Superconductors*, Nelson et al, eds., Am. Chem. Soc. (1987).

A. J. Bruce et al., "Size Effects on the Superconducting Properties of Polycrystalline Aggregates of Ba$_2$YCu$_3$O$_{7-\delta}$ Cuprates", *Mat. Res. Bull.* 23, pp. 349–355, 1988. No month.

H. D. Brody et al., "Highly Textured Single Crystal Bi$_2$CaSr$_2$Cu$_2$O$_x$ Prepared by Laser Heated Float Zone Crystallization," *J. Cryst. Growth* 96, pp. 225–233 (1989). No month.

N. Naito et al., "Fabrication of Superconducting Powders, Tapes and Wires at GTEL", presented at Argonne National Laboratories 09 Nov. 1988.

N. Naito et al., poster talk on texturing of high temperature superconductors, presented at Materials Research Society meeting, Boston, Mass., 30 Nov. 1988.

J. S. Haggerty et al., "Growth of Superconducting Oxides from Float Zone Melts," presented American Ceramic Soc. Mtg. 25 Apr. 1989.

A. A. Shapiro et al., "Screen Printable High Temperature Superconducting Thick Films," presented American Ceramic Soc. Mtg. 25 Apr. 1989.

K. Sawano et al., "Microstructure Evolution of YBa$_2$Cu$_3$O$_x$ by Partial Melting," presented American Ceramic Soc. Mtg. 25 Apr. 1989.

N. McN. Alford et al., "Physical and Mechanical Properties of Bi–Pb–Sr–Ca–Cu–O Superconductors," presented American Ceramic Soc. Mtd. 26 Apr. 1989.

N. McN. Alford et al., "Critical Current Densities of Sintered And Melt-textured YBa$_2$Cu$_3$O$_x$," presented American Ceramic Soc. Mtg. 26 Apr. 1989.

G. Lu et al., "Directional Solidification of YBa$_2$Cu$_3$O$_7$," presented American Ceramic Soc. Mtg. 26 Apr. 1989.

Liu et al, "Superconductivity and Structure of Single Crystal YBa$_2$Cu$_3$O$_x$" *Physics Letters A* vol. 121 #6 4 May 1987 pp. 305–306.

Krol et al, "Local Environment Around Barium Atoms in the Superconductor Y–Ba–Cu–O" Mat Res Soc Symp Proc vol. 99 1988 pp. 608–612.

Kaiser et al, "Growth of YBa$_2$Cu$_3$O$_x$ Single Crystals" Apply Phy Lett.

[001] ZONE AXIS

SCBED PATTERN

HIGHLY ORIENTED SUPERCONDUCTOR OXIDE CERAMIC PLATELETS AND PROCESS FOR THE PRODUCTION THEREOF

BACKGROUND OF THE INVENTION

This invention relates to copper oxide-based ceramic superconducting materials, and in particular to a process for the production of large yields of such materials in the form of highly oriented platelets exhibiting a superior ac magnetic susceptibility when compared to powders.

The recently discovered copper oxide-based superconducting materials have great potential for use in such applications as energy production, electronics, transportation, medicine, and research. Material parameters for such technologies require a high and stable current density ($J_c$) on the order of $10^6 A/cm^2$ or greater at 77K. Although $J_c$'s greater than $10^6 A/cm^2$ at 77K have been achieved in thin films, limited success has been achieved with sintered polycrystalline samples. The limitations are related to the intrinsic properties of the ceramic superconducting materials.

The existence of an anisotropic conduction plane in the crystal structure of these materials, coupled with the existence of grain boundaries formed during powder consolidation limit the current densities achievable with bulk processed materials. In any one particle there may exist several unaligned grains causing the conduction planes to be misaligned. Recent theories explaining the concept of superconductivity indicate that misalignment of conduction planes is one of the factors which leads to loss in energy, thus decreasing the current density of the material. Also, in bulk superconductors, grain boundaries act as reservoirs for impurities and other multiphase components, resulting in further energy loss. Therefore, the homogeneity of the synthesized powder has been found to be highly important to the achievement of high current densities in this material.

The orientation of single phase superconducting oxide particles would allow conduction to be more continuous within each particle. Due to the crystal structure of, for example, $YBa_2Cu_3O_x$, the ideal morphology of these particles is plate-like with a short c-axis and conduction occurring in the relatively large, flat a-b plane. The use of materials in the form of such platelike crystallites would allow for improved grain alignment in subsequent forming processes, This grain alignment will further increase the critical current density.

Several researchers have indicated methods of growing single crystals. However, these methods utilize fluxes (e.g., excess CuO) and the formation of a total melt at temperatures greater than, for example, 1020° C. for $YBa_2Cu_3O_x$, which is undesirable. $YBa_2Cu_3O_x$ melts incongruently in air at 1020° C. On cooling, such incongruently melted materials form eutectic phases which are insulating or semiconducting. The single crystals resulting from complete melt techniques comprise only a small portion of the material, and reside in the cracks of the solidified product, making separation of the crystals from the melt extremely difficult and costly.

SUMMARY OF THE INVENTION

A process, in accordance with one aspect of the invention, for production of highly oriented platelets of a superconducting oxide ceramic material from suitable precursor materials involves calcining at a calcination temperature and in a non-reducing atmosphere a homogeneous mixture consisting essentially of stoichiometric proportions of the precursor materials, in a vessel not wetted by melts of the precursor materials at the calcination temperature. The calcination temperature is below the peritectic melt temperature of the superconducting material. The calcination temperature is also at or above a temperature and for a time sufficient to effect partial melting of at least one of the precursor materials to a degree sufficient to effect diffusion of at least one of the precursor materials throughout the mixture. The calcined mixture is then annealed in a non-reducing atmosphere.

In a narrower aspect of the invention, the calcining step is a two-stage step involving calcining the mixture at first calcination temperature for at least 15 hours to form an intermediate product, then further calcining the intermediate product at a second calcination temperature below the first calcination temperature for at least an additional 10 hours. The first and second calcination temperatures are each below the peritactic melt temperature of the superconducting material and at or above a temperature and for a time sufficient to effect partial melting of at least one of the precursor materials. The calcining and further calcining steps combined are sufficient to effect diffusion of at least one of the precursor materials throughout the mixture.

A process, in accordance with another narrower aspect of the invention, for production of highly oriented platelets of a superconducting oxide ceramic material of the formula $YBa_2Cu_3O_x$, wherein x is about $6.5 \leq X \leq 7.0$, involves calcining at a temperature of about, 965°–982° C. and in a non-reducing atmosphere a homogeneous mixture having equivalent diameters of less than about 5 $\mu m$ and consisting essentially of stoichiometric proportions of $BaCO_3$, $Y_2O_3$, and $CuO$ powders. The calcining is carried out in a vessel not wetted by melts of the powders at the calcination temperature. The calcination time is sufficient to effect diffusion of at least one of the precursor materials throughout the mixture. The calcined mixture is then annealed in a non-reducing atmosphere.

In accordance with yet another aspect of the invention is provided a single phase superconducting oxide ceramic material produced from suitable precursor materials by a process involving calcining at a calcination temperature and in a non-reducing atmosphere a homogeneous mixture consisting essentially of stoichiometric proportions of the precurser materials. The calcining is carried out in a vessel not wetted by melts of the precursor materials at the calcination temperature. The calcination temperature is below the peritactic melt temperature of the mixture. The calcination temperature is also at or above a temperature and for a time sufficient to effect partial melting of at least one of the precursor materials to a degree sufficient to effect diffusion of at least one of the precursor materials throughout the mixture. The calcined mixture is then annealed in a non-reducing atmosphere.

In accordance with still another, narrower aspect off, the invention is provided a single phase superconducting oxide material of the formula $YBa_2Cu_3O_x$, wherein x is about $6.5 \leq X \leq 7.0$, produced by a process involving calcining at a temperature of about 976°–982° C. and in a non-reducing atmosphere a homogeneous mixture having equivalent diameters of less than about 5 $\mu m$ and consisting essentially of stoichiometric proportions of $BaCO_3$, $Y_2O_3$, and CuO powders. The calcining takes place in a vessel not wetted by melts of the powders at the calcination temperature. The mixture is calcined for a time sufficient to effect diffusion of at least one of the precursor materials throughout the mixture. The calcined mixture is then annealed in a non-reducing atmosphere.

BRIEF DESCRIPTION OF THE DRAWINGS

For a better understanding of the present invention, together with other objects, advantages and capabilities thereof, reference is made to the following Description and appended claims, together with the Drawings, in which:

DETAILED DESCRIPTION OF THE PREFERRED EMBODIMENTS

The present invention presents to the art a process for calcination of mixtures of the above-described oxide or other suitable precursor powders which is controlled to yield highly oriented particles which are single phase and resemble the single crystalline structure. The resulting product is orthorhombic in crystal structure, with a flat c-axis and long a/b-axes. This structure is favorable to current conduction because current travel along the a/b axes is greater than along the c axis, for example in $YBa_2Cu_3O_x$.

Figure 1:
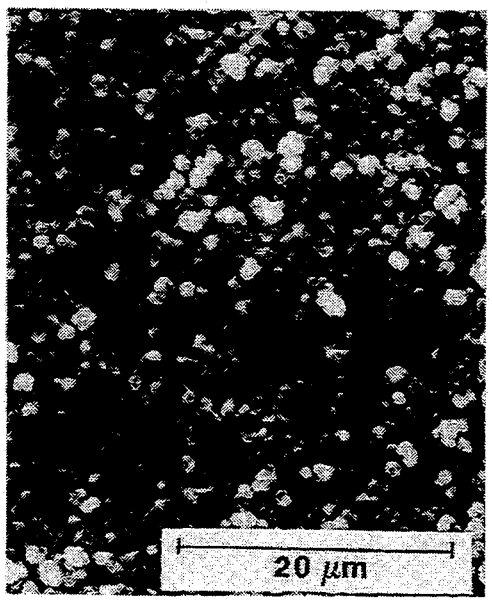
FIG. 1 is a scanning electron photomicrograph of a starting powder mixture of the preferred size, size distribution, and morphology.

The process requires thorough mixing of the starting precursor powders to achieve homogeneity. The precursors, e.g. Y, Ba, Cu containing components, are in essentially stoichiometric ratio (i.e. ±1%), for example Y:Ba:Cu=1:2:3. Preferably the powders are spherical, exhibit a small grain size (<10 μm, preferably <5 μm) and narrow size distribution, and are free of agglomerates. FIG. 1 illustrates a starting powder mixture of the preferred morphology. The stochiometric mixture of yttrium oxide, barium carbonate, and copper oxide shown therein is a monosized, approximately 1-2 spherical powder prepared by wet ball milling of the component powders in a FREON®TF (trichlorotrifluoroethane) suspension for about 49 hrs using high density zirconia balls. (FREON is a registered trademark of E. I. dupont de Nemours & Co. ) The viscosity and volume ratios were calculated to produce an agglomerate free ball milled mixture having the desired powder parameters.

The precursors are advantageously in the form of oxides, e.g. $Y_2O_3$, BaO, CuO, but any suitable precursor materials, i.e. those which decompose on calcination to yield the desired oxides may be used, e.g. carbonates such as $BaCO_3$, nitrates, or other precursor materials. Thus the term "precursor materials" as used throughout this specification and appended claims includes any materials yielding the desired oxide components on calcining according to the process of the invention.

The calcination process requires accurate control of the calcination temperature and time, at a temperature below the peritectic melting point of the superconducting compound, e.g. well below 1020° C. in air for yttrium barium copper oxide, to a degree sufficient to result in controlled partial melt formation for enhanced diffusion. The term "partial melting" or "partial melt formation " as used herein refers to the retention of the majority of the powder as a solid with minor amounts of a transient liquid being formed. This liquid formation is not related to peritectic melting e.g. that occurring in $YBa_2Cu_3O_x$-forming powders in air at temperatures greater than 1020° C.

Figure 2:
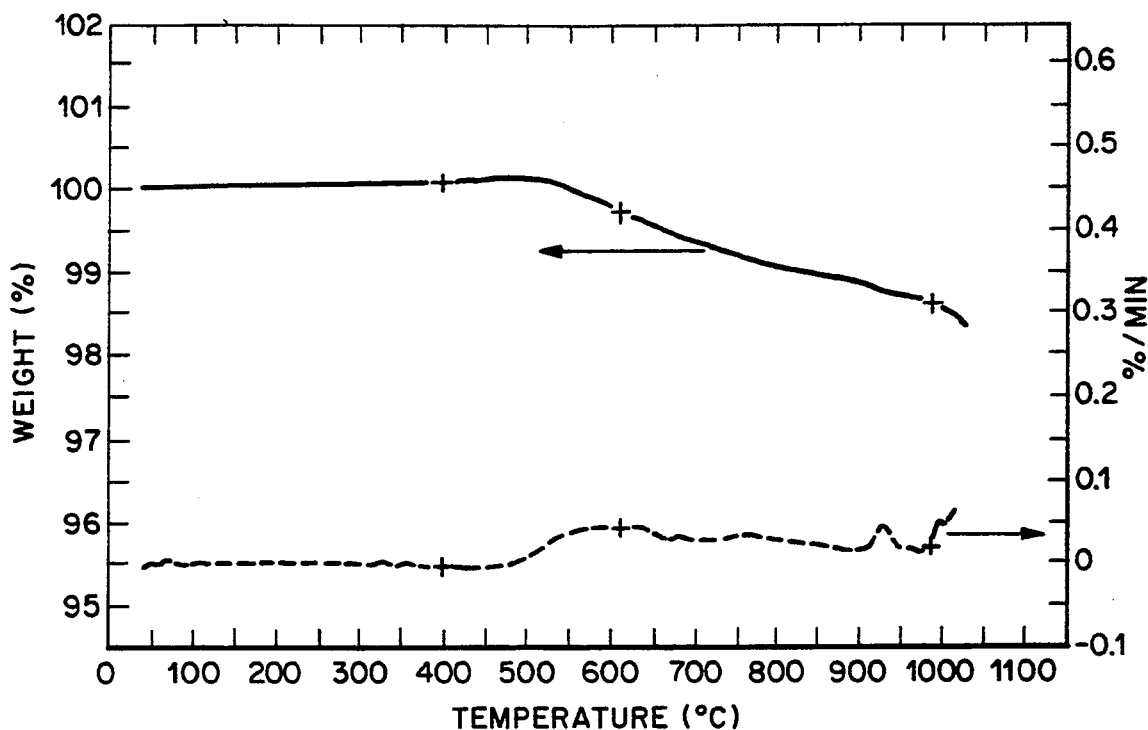
FIGS. 2 and 3 are graphical representations of the data obtained from thermogravimetric and differential thermal analyses of a representative calcined ceramic superconductor.
Figure 3:
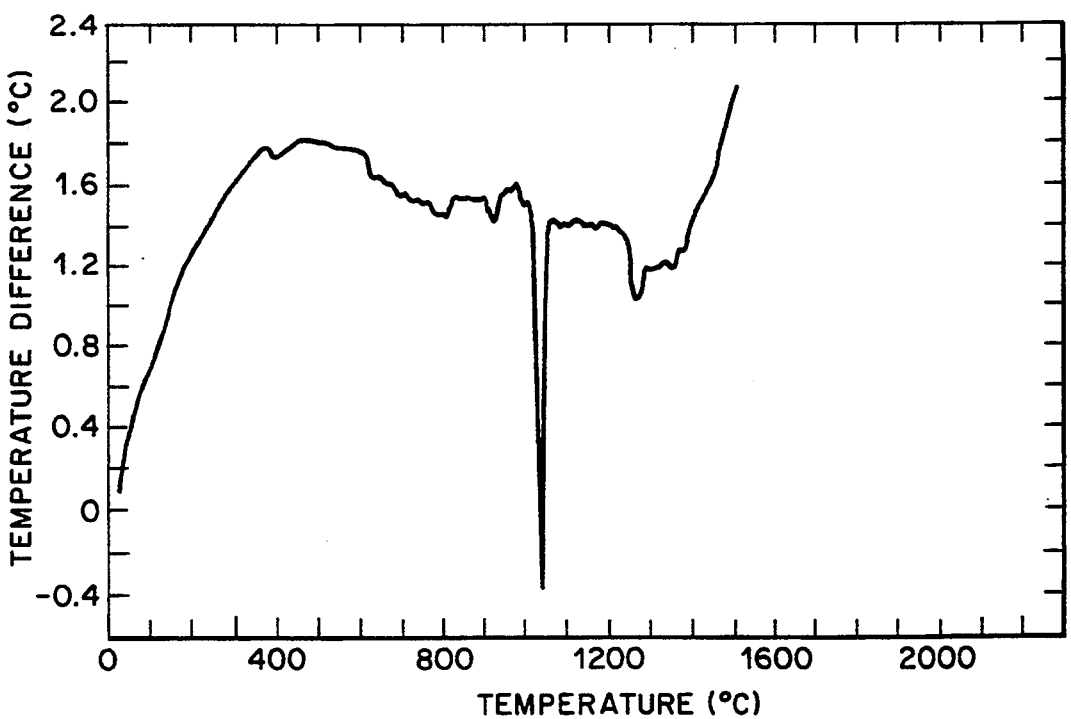
Figure 4:
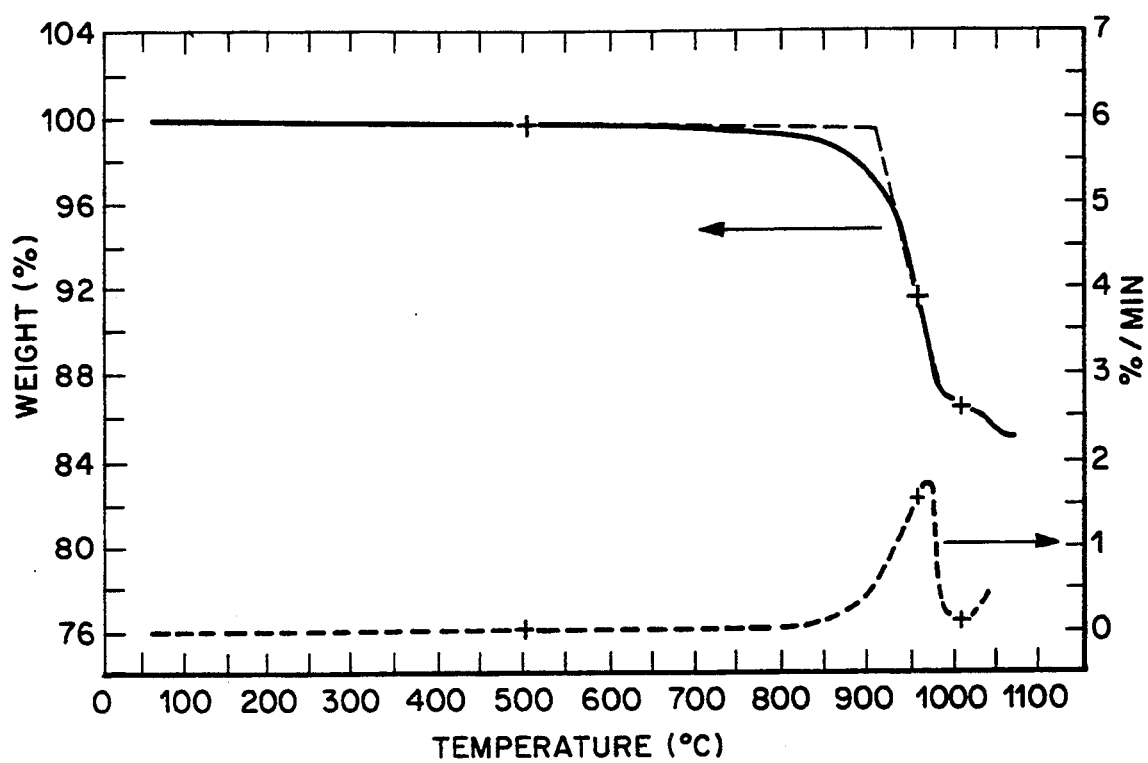
FIGS. 4 and 5 are graphical representations of similar data obtained for the green starting powder of the ceramic superconductor of FIGS. 2 and 3.
Figure 5:
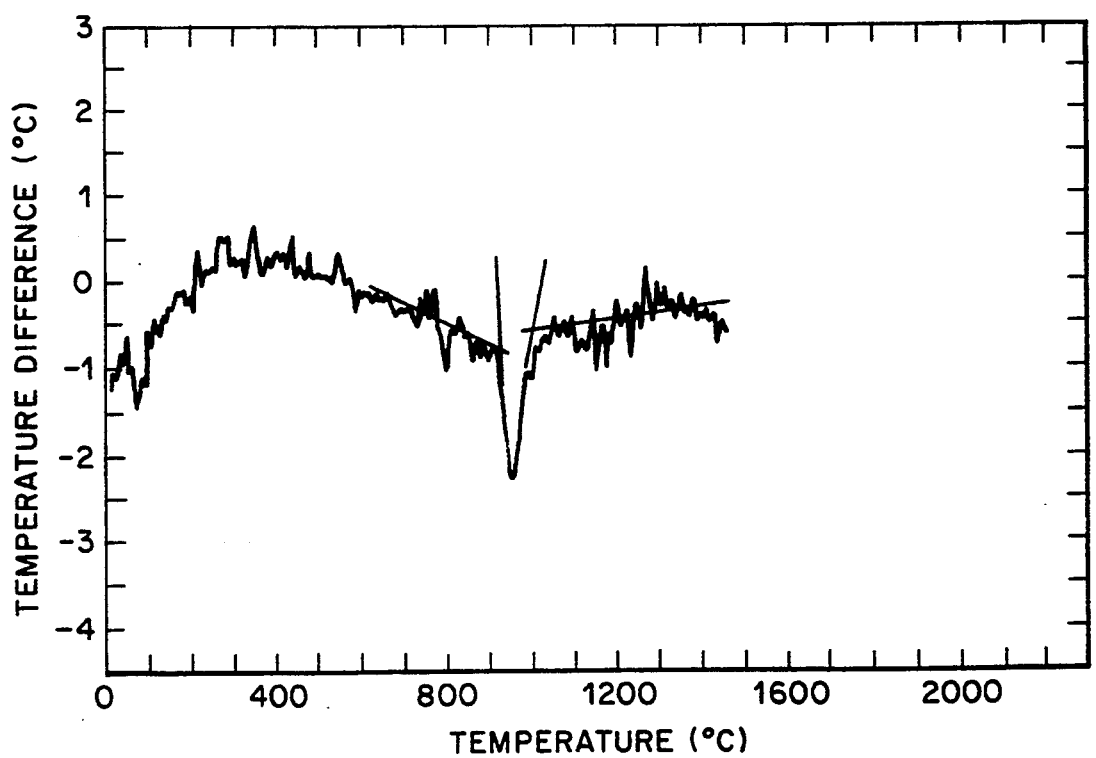

The difference between the two types of melting is illustrated in FIGS. 2-5. The Figures represent TG (thermogravimetric analysis) and DTA (differential thermal analysis) plots, in FIGS. 2-3 for calcined superconducting yttrium barium copper oxide (Y:Ba:Cu=1:2:3), and in FIGS. 4-5 for uncalcined precursor powders of yttrium oxide, barium carbonate, and copper oxide, in stoichiometric ratio for the formation on calcining of the yttrium barium copper oxide of FIGS. 2-3. The upper curves of FIGS. 2 and 4 illustrate the % weight change with increasing temperature for the compound and the precursor mixture respectively, while the lower curves show derivatives of the weights plotted in the upper curves in % per minute. The curves of FIGS. 3 and 5 illustrate the variation in sample temperature with increasing ambient temperature for the same materials. A comparison of the two sets of curves shows a difference in the temperature at which liquid phase melt appears FIGS. 2-3 show a liquid phase at about 1020° C. as peritectic melting of the calcined compound takes place in air. FIGS. 4-5 show partial melting forming a liquid phase below about 970° C. in the precursor mixture. Thus partial melt formation as described above takes place in these precursor materials at a temperature well below the peritectic melting point of superconducting yttrium barium copper oxide.

The partial melting involves at least one precursor component in the mixture or a eutectic of any components of the precursor mixture. Thus, as used throughout this specification and appended claims, the term "partial melting of at least one precursor" is intended "to involve one or more eutectic compositions of any components of the precursor mixture as well as one or more of the precursors themselves.

The result is a bulk powder formation method of achieving highly oriented platelets of single phase orthorhombic materials exhibiting a superior ac magnetic susceptibility when compared to powders. No fluxing agents are required for this process, and the need for complete melting of the precursor powders is eliminated. Further, a high proportion of the starting formulation is converted to the desired oriented superconducting platelets, enabling use of the process for bulk powder production. Thus a superior product is produced in a simplified process at a redfaced production cost.

Figure 6:
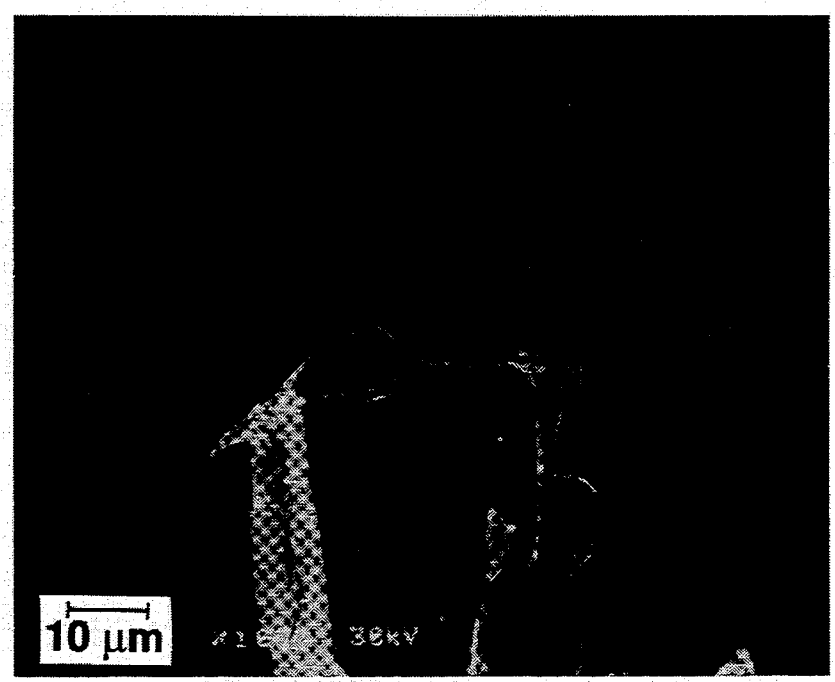
FIGS. 6 and 7 are scanning electron photomicrographs of oriented superconducting ceramic platelets in accordance with the invention.
Figure 7:
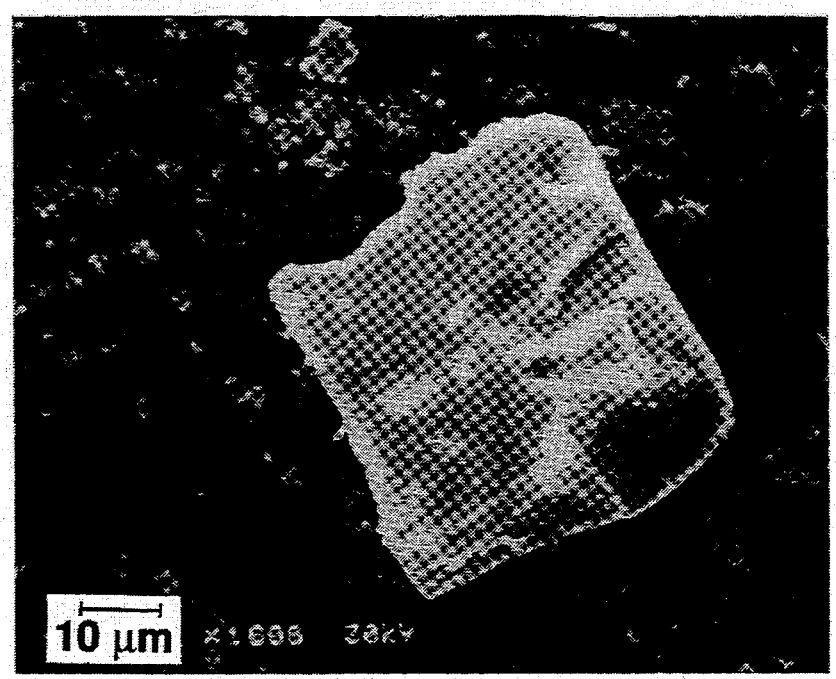

The product of the above-described bulk powder process is made up of about 50% crystalline platelets of $YBa_2Cu_3O_x$ having the perovskite structure. Illustrative platelets formed by the process are shown in FIGS. 6 and 7. The crystals are plate-like, rectangular, oriented, and about 10–20 μm along the c-axis and about 50–100 μm along the a- and b-axes.

Figure 8:
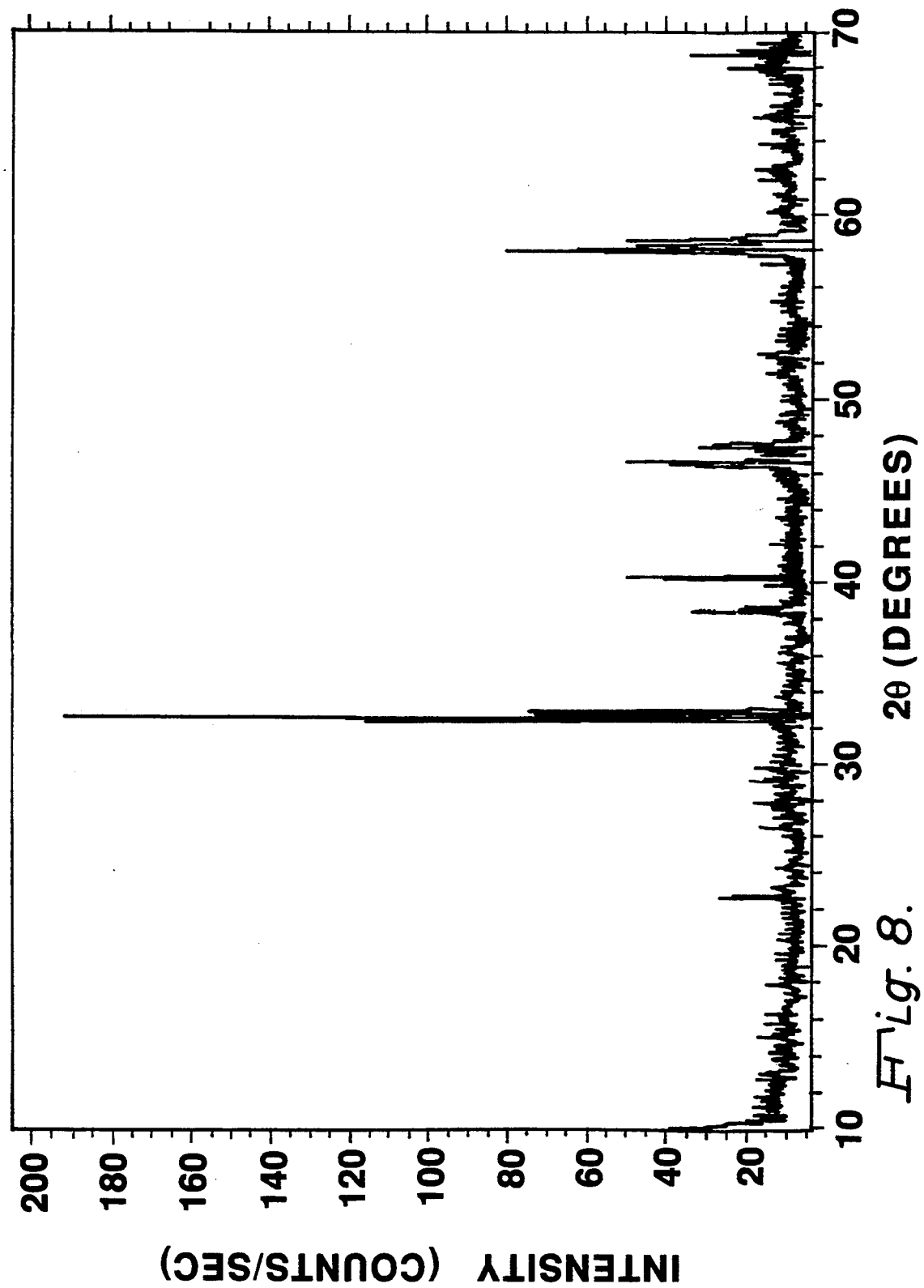
FIG. 8 is a graphical representation of the X-ray diffraction pattern of aligned platelets in accordance with the invention.

FIG. 8 is an X-ray diff,;action pattern of yttrium barium copper oxide platelets produced according to the bulk process described above. The X-ray diffraction pattern exhibits sharp peaks with minimal splitting, indicating high degree of orientation. The material is also shown to be nearly completely single phase, from X-ray diffraction measurements, with any extraneous peaks being nearly indistinguishable from the background noise.

Figure 9:
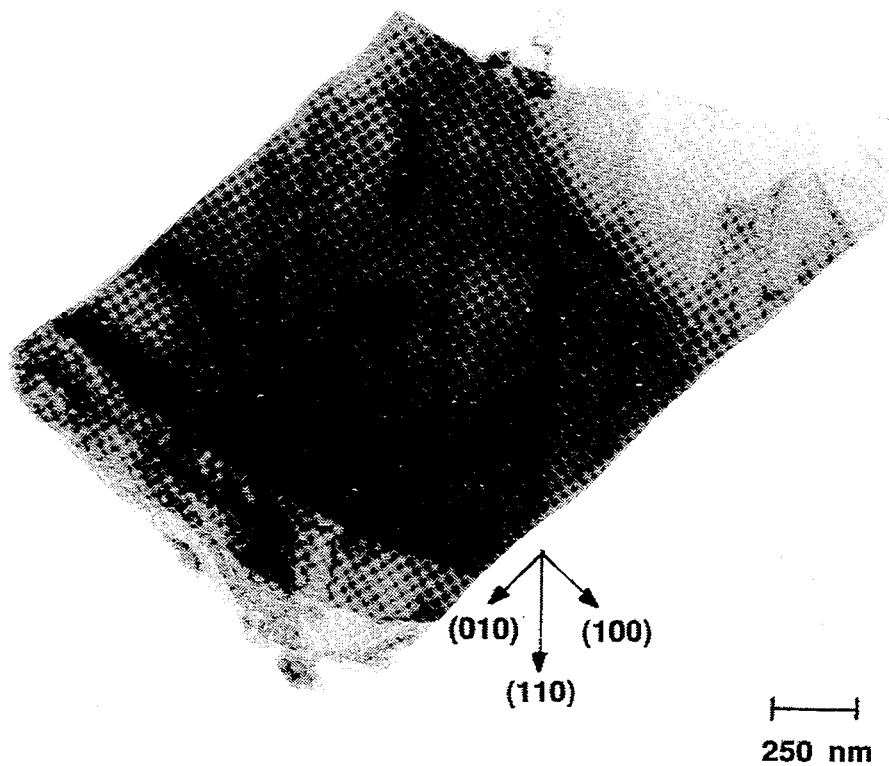
FIG. 9 is a scanning transmission electron microscope (STEM) image illustrating the crystallographic orientation of an oriented platelet in accordance with the invention.
Figure 10:
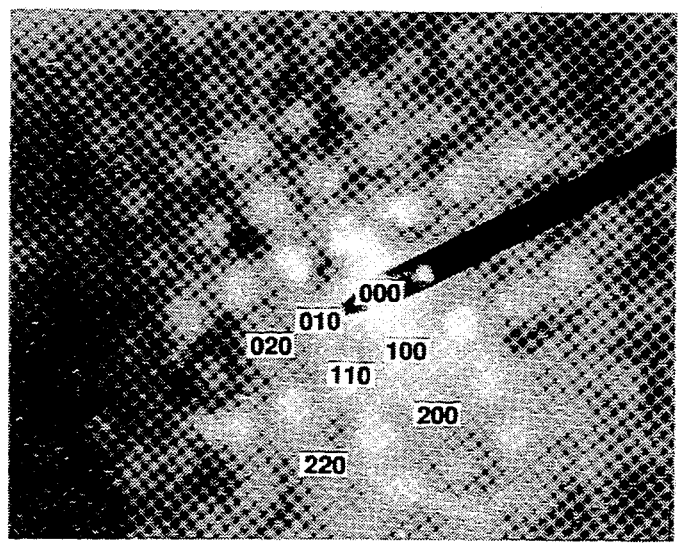
FIG. 10 is a photomicrograph of the STEM semiconvergent beam electron diffraction pattern obtained from an oriented platelet in accordance with the invention.

The crystallographic orientation of the platelets was analyzed using a Philips 400T scanning transmission electron microscope (STEM). FIG. 9 illustrates a typical platelet. The orientation of the platelet is evident from the labelled axes: {010}, {100}, and {110}. Semiconvergent beam electron diffraction (SCBED), as shown in FIG. 10, shows that twinning occurs in the (110) planes, indicative of the orthorhombic structure of $YBa_2Cu_3O_x$. The term "twinning" as used herein refers to the formation of adjacent portions of the crystal which are oriented with respect to one another symmetrically about certain crystallographic planes, called "twinning planes". Also, lattice spacings of the $YBa_2Cu_3O_x$ crystal agree with the values indicated in the powder diffraction data available in the literature for the orthorhombic phase of the compound.

Figure 11:
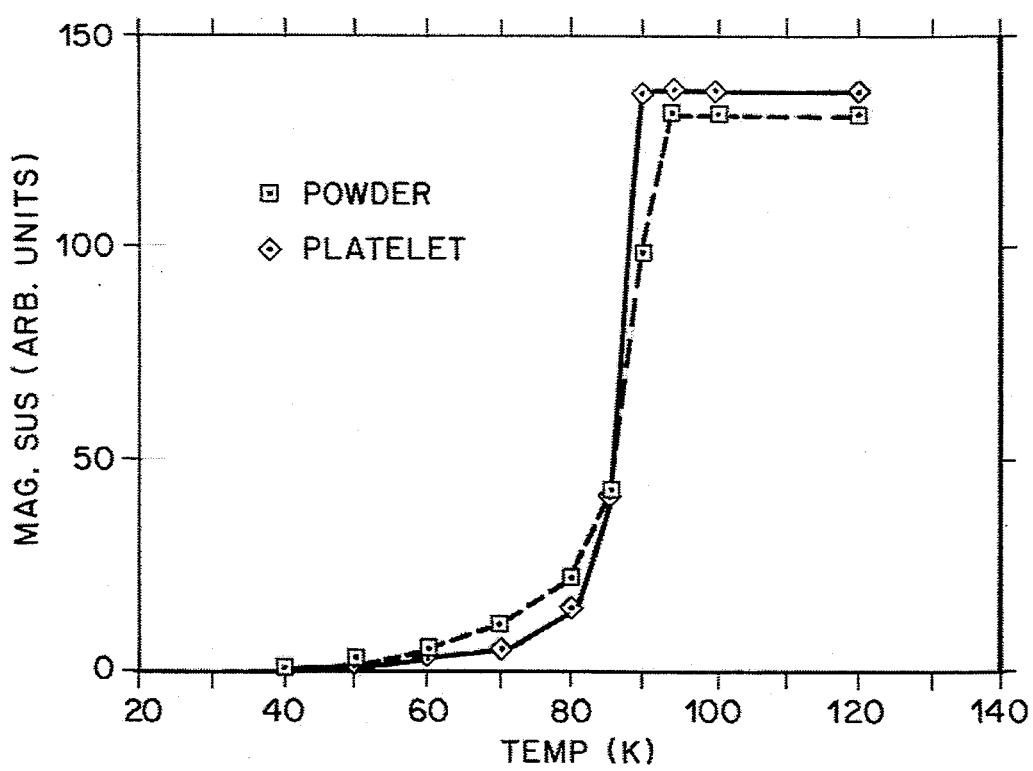
FIG. 11 is a graphical representation of the ac magnetic susceptibilities of powder and platelet from ceramic superconductors calcined from the same green powder batch.

FIG. 11 shows a plot of the ac magnetic susceptibility versus temperature for $YBa_2Cu_3O_x$ powders and platelets produced from the same batch of mixed green precursor materials by calcining processes which were nearly identical except as follows. The powders were calcined using a prior art standard temperature process involving a temperature below that at which a partial melt forms. The platelets were produced using controlled partial melting by the novel process described above. (A comparison of the curves for the prior art sintered powder and the platelet material shows a steeper slope at the superconducting transition temperature for the platelet material according to the invention than for the prior art material.) The ac magnetic susceptibility plot is further evidence of the achievement of superior superconducting properties using the platelet formation process described above.

Important experimental parameters in practicing the process according to the invention include homogeneous mixing of the unreacted precursor materials, controlled thermal processing, and selection of a non-wetting calcination vessel. As used throughout this specification and appended claims, the terms "non-wetting" and "non-wetted" are intended to refer to materials which are not appreciably wetted, i.e. not wetted to a degree sufficient to significantly alter the stoichiometric balance, by the materials contained therein. The pressure under which the calcination is carried out is not critical, but a flowing atmosphere, i.e. at about 1 atm, is preferred. Subsequent annealing is carried out in a non-reducing atmosphere, and normally in a flowing atmosphere, thus at about 1 atm.

The following description is directed to an $YBa_2Cu_3O_x$ superconducting material, which is presented as illustrative of the process and superconducting material according to the invention, and not limiting thereof.

As described above, the anisotropic conduction properties of $YBa_2Cu_3O_x$ in bulk or powder form prepared by known processes result in materials exhibiting low critical current density. One of the major causes of low $J_c$ is the random orientation of the grains within the particles, as well as the random orientation of the particles themselves within the sintered bulk material. The process according to the invention results in formation of highly oriented platelets. Analysis of the platelets by scanning transmission electron microscopy shows them to be highly crystalline in nature.

A stoichiometric ratio of the starting components, $BaCO_3$, $Y_2O_3$, and CuO, Y:Ba:Cu=1:2:3, are thoroughly blended, A stoichiometric ratio of the starting components, , $BaCO_3$ Yhd $2O_3$, and CuO, Y:Ba:Cu=1, 2, 3, are thoroughly blended, preferably by wet milling, to obtain a highly homogeneous mixture of <10 μm size, and preferably <5 μm size green powders. Complete mixing is a critical step in the process to ensure the uniform distribution of each precursor component in the green precursor material. Also important is obtaining a high surface area, i.e. small particle size, in the powders. Correct thermal processing without complete mixing will not result in the formation of the platelet structure.

The thermal processing cycle, or careful control of the thermal conditions during calcination, is also critical in the achievement of the desired platelet structure. The required temperature for calcination of the mixture of yttrium oxide, barium carbonate, and copper oxide precursor materials is about 965°–982° C., with a temperature of about 978°–982° C. preferred, normally for at least about 15 hours, the optimum time being dependent on the temperature. The temperature should be sufficiently below the peritactic melting temperature of $YBa_2Cu_3O_x$ to prevent peritactic melting, and the time and temperature must be selected and controlled to result in partial melting of at least one precursor component in the mixture, or a eutectic of any combination of the starting precursors, to a degree sufficient to enhance diffusion of the starting precursor components throughout the mixture. Most preferred is a two-step calcination process involving heating the starting powders to about 978°–982° C. for about 15 hours, then lowering the temperature to about 965°–975° C. for an additional time of about 10 hours.

Use of crucibles or other containers for the calcination process that are not wetted by any melt formed during the calcination process is also important. The grain growth and restructuring, from about 5 μm size or smaller green powder particles to e.g. a 50×50×20 μm size post-sintered platelet, require diffusion of the precursor materials during calcination. Partial melt formation is an important feature of the process according to the invention. This partial liquid formation is not related to the peritactic melting which occurs in mixtures of powders, e.g. in $YBa_2Cu_3O_x$ forming powders at temperatures greater than 1020° C. in air. This is evident from the TG/DTA data, as described above, which indicates the formation of a transient liquid phase starting at about 930° C. and ending at about 1020° C., with the peak occurring at about 960°–970° C.

As the partial melt forms, the diffusion of $YBa_2Cu_3O_x$ precursor components is enhanced. At temperatures above 960° C., this partial melt will wet some crucible materials, e.g. MgO. This wetting of the crucible during calcination results in the migration of the formed partial melt toward the crucible wall. The partial melt is in this case retained at or near the powder/crucible interface after calcination. Thus, the stoichiometric balance is disturbed, and the formed partial melt is not available throughout the material to enhance diffusion. Other crucible materials, e.g. alumina, are not wetted by the melt. This results in greater retention of the formed partial melt within the material at the processing temperature, effective diffusion of the partial melt components throughout the material, and formation of highly crystalline platelets of $YBa_2Cu_3O_x$ in the product.

Powders calcined as described above are largely transformed into platelets, the morphology and structure of which, as described above, exhibit growth facets indicating a high degree of crystallinity of such platelets. Scanning transmission electron microscopy and electron diffraction analyses, also as described above, confirm the highly crystalline platelet structure of the product.

The following Examples are presented to enable those skilled in the art to more clearly understand and practice the present invention. These Examples should not be considered as a limitation upon the scope of the present invention, but merely as being illustrative and representative thereof.

EXAMPLES 1-4

A mixture of powders containing 30.0 gm $Y_2O_3$, 105.0 gm $BaCO_3$, and 63.3 gm CuO was wet ball milled in 400 ml Freon®TF using 2 Kg dense zirconia balls for 24 hrs to form a homogeneous, uniform, approximately 1 μm spherical powder. Three batches of the powder were calcined in an alumina crucible in air of 1 atm pressure to form yttrium barium copper oxide. The calcined products were cooled in air at a rate of about 2°-3° C./min. All of the products were then annealed in a tube furnace by heating to about 450° C. in flowing oxygen, then cooling to room temperature at a rate of less than about 1° C./ min., as shown below in Table I. The calcining parameters and the results for each Example are listed below in Table II.

TABLE I

| Temperature Range, °C. | Cooling Rate, °C./min |
|---|---|
| 450-400 | 0.75 |
| 400-350 | 0.56 |
| 350-300 | 0.49 |
| 300-250 | 0.43 |
| 250-200 | 0.36 |
| 200-150 | 0.32 |

TABLE II

| Example | Calcining Temp., °C. | Calcining Time, hrs | Total Time, hrs | Results |
|---|---|---|---|---|
| 1 | 976-977 | >60 | >60 | Incomplete platelet formation |
| 2 | 978-982 | 15 | 15 | Incomplete platelet formation |
| 3 | 977-978 | 40 | 40 | Good platelet formation in bulk of calcined material, but some platelets are mechanically attached |
| 4 | 978-982 / 969-975 | 15+ / 10+ | 25+ | Distinct platelets in bulk of calcined material |

As seen in Table II, platelets begin to form in the material of Example 1 at a relatively low temperature, but even extensive heat treating did not complete the formation of the platelets. In Example 2, incomplete formation of the platelets also occurred due to insufficient calcining time. In Example 3, high quality platelets were formed, most of the material being in the form of highly oriented platelets. The most desirable platelet formation took place in Example 4, where most of the material was in the form of highly oriented platelets. All of the platelets of Example 4 were distinct from one another, eliminating the need for mechanical separation of the platelets.

The process and product according to the present invention provide to the art highly oriented crystalline platelets of superconducting oxide ceramic materials. Thus, the current limiting effect of the anisotropy of the conduction planes within the material is minimized, and grain boundaries within each particle and the associated current density limitations are substantially decreased.

While there have been shown and described what are at present considered the preferred embodiments of the invention, it will be obvious to those skilled in the art that various changes and modifications can be made therein without departing from the scope of the invention as defined by the appended claims.

We claim:

1. A process for production of highly oriented platelets of a superconducting rare earth barium copper oxide ceramic material from suitable precursor materials comprising the steps of:

calcining in a non-reducing atmosphere a homogeneous mixture consisting essentially of stoichiometric proportions of the precursor materials, in an aluminum oxide vessel;

wherein the calcining step is a two-stage step comprising calcining the precursor mixture at a first calcination temperature of about 980° C. for at least about 15 hours to form an intermediate product, and further calcining the intermediate product at a second calcination temperature of about 972° C. for at least about an additional 10 hours;

wherein the calcining and further calcining steps combined are sufficient to effect diffusion of at least one of the precursor material throughout the mixture.

2. A process for production of a highly oriented bulk superconducting copper oxide ceramic material of the formula $YBa_2Cu_3O_x$ wherein x is about $6.5 \leq X \leq 7.0$, and the bulk material comprises at least about 50% highly oriented platelets, the process comprising the step of:

calcining in a non-reducing atmosphere a homogeneous mixture having an equivalent diameter of less than about 5 μm and consisting essentially of stoichiometric proportions of $BaCO_3$, $Y_2O_3$, and CuO powders, in an aluminum oxide vessel, for a time sufficient to effect diffusion of at least one of the precursor materials throughout the mixture;

wherein the calcining step is a two-stage step comprising calcining the mixture at a first temperature of about 980° C. for about 15 hours to form an intermediate product, and further calcining the intermediate product at a second temperature of about 972° C. for about an additional 10 hours.

3. A highly oriented bulk superconducting rare earth barium copper oxide ceramic material comprising at least about 50% highly oriented orthorhombic platelets, wherein the ceramic material is produced from suitable precursor materials by a process comprising the step of:

calcining in a non-reducing atmosphere a homogeneous mixture consisting essentially of stoichiometric proportions of the precursor materials, in an aluminum oxide vessel;

wherein the calcining step is a two-stage step comprising calcining the mixture at a first calcination temperature of about 980° C. for at least about 15 hours to form an intermediate product, and further calcining the intermediate product at a second calcination temperature of about 972° C. for at least about an additional 10 hours;

wherein the calcining and further calcining steps combined are sufficient to effect diffusion of at least one of the precursor materials throughout the mixture.

4. A highly oriented bulk superconducting copper oxide ceramic material of the formula $$YBa_2Cu_3O_x$$

wherein x is about $6.5 \leq X \leq 7.0$; wherein the bulk ceramic material comprises at least about 50% highly oriented platelets and is produced by a process comprising the steps of:

calcining in a non-reducing atmosphere a homogeneous mixture having equivalent diameters of less than about 5 μm and consisting essentially of stoichiometric proportions of $BaCO_3$, $Y_2O_3$, and CuO powders, in an aluminum oxide vessel, for a time sufficient to effect diffusion of the $BaCO_3$, $Y_2O_3$, and CuO throughout the mixture;

wherein the calcining step is a two-stage step comprising calcining the mixture at a first temperature of about 980° C. for about 15 hours to form an intermediate product, and further calcining the intermediate product at a second temperature of about 972° C. for about an additional 10 hours.

* * * * *